United States Patent [19]

Thurlemann et al.

[11] Patent Number: 4,903,883

[45] Date of Patent: Feb. 27, 1990

[54] APPARATUS FOR ULTRASONIC CONTACTING WIRE CONNECTION OF CIRCUITS TO ELECTRONIC COMPONENTS

[75] Inventors: Silvan Thurlemann, Hagendorn; Claudio Meisser, Cham; Hans Eggenschwiler, Steinhausen, all of Switzerland

[73] Assignee: ESEC SA, Cham, Switzerland

[21] Appl. No.: 347,854

[22] Filed: May 5, 1989

[30] Foreign Application Priority Data

| May 5, 1988 | [CH] | Switzerland | 1704/88 |
| May 5, 1988 | [CH] | Switzerland | 1705/88 |
| Dec. 28, 1988 | [CH] | Switzerland | 4814/88 |

[51] Int. Cl.$^4$ .............................................. B23K 20/10
[52] U.S. Cl. ...................... 228/1.1; 228/4.5; 228/110
[58] Field of Search ............... 228/1.1, 4.5, 110, 179; 219/56.21

[56] References Cited

U.S. PATENT DOCUMENTS

| 4,571,688 | 2/1986 | Kashihara et al. ............... 228/1.1 |
| 4,610,387 | 9/1986 | Scavino ............................ 228/110 |
| 4,718,591 | 1/1988 | Hill ................................... 228/1.1 |

Primary Examiner—Richard K. Seidel
Assistant Examiner—Samuel M. Heinrich
Attorney, Agent, or Firm—Helfgott & Karas

[57] ABSTRACT

Apparatus for ultrasonic bonding wire connection of circuits to electronic components comprises a casing-like carrier member carrying a bonding assembly mounted therein so as to pivot about an axis (Z), and including a first support frame operatively connected to an electromotive drive and a second support frame constructed for receiving an energy transducer carrying a capillary element. In a first movement phase of the bonding assembly, both support frames are jointly movable about the axis (Z) and in a second movement phase, the second support frame with the energy transducer is movable about an articulation (Z') spaced from the axis (Z) relative to the first support frame. For obtaining the necessary positional stability of the second support frame, a common mass center of the individual elements is located within a circle, the center of which is located between the axis (Z) and the articulation (Z').

13 Claims, 6 Drawing Sheets

APPARATUS FOR ULTRASONIC CONTACTING WIRE CONNECTION OF CIRCUITS TO ELECTRONIC COMPONENTS

BACKGROUND OF THE INVENTION

The present invention relates to a bonding apparatus utilized in semiconductor connecting technology, particularly for the ultrasonic contacting wire connection of circuits to electronic components by means of bonding members mounted in pivotable manner about an axis. An apparatus of the type under discussion comprises a first support frame operatively connected to an electromotive drive and a second frame constructed for receiving an energy transducer having a capillary element engageable with the individual electronic components.

U.S. Pat. No. 4,610,387 discloses a bonding apparatus for ultrasonic wire welding, which essentially comprises a first, a second and a third fork-like support frame. The first support frame arranged on a main carrier and operatively connected to a first motor and a correspondingly associated crank is adjustable with the second and third support frames mounted thereon so as to pivot about a common axis relative to the main carrier roughly in the vertical direction, i.e. in the direction of correspondingly associated electronic components (chips). The third support frame is operatively connected to a second motor constructed as a linear motor, and the second support frame is constructed for receiving an energy converter (transducer) provided at its front end with a capillary element. On the second and third support frames, which are movable relative to one another, are provided correspondingly arranged contacts, which in a first phase, can be engaged by an electromagnet acting on the second support frame.

SUMMARY OF THE INVENTION

It is an object of the present invention to provide a bonding device for an apparatus of the aforementioned type, which ensures a highly dynamic, roughly vertically oriented delivery movement of the support frame with the transducer for the wire connection of circuits to each electronic component without, during the common pivoting movement, a relative movement of the support frame with the transducer with respect to the other support frame.

This and other objects of the present invention are attained by an apparatus in which two support frames, together with the transducer, are mounted so as to pivot about an axis arranged in a carrier element and the second support frame with the transducer is movable about a joint or articulation located at a distance from the axis relative to the first support frame and wherein, for obtaining the necessary positional stability, a common mass center of the individual elements pivotable relative to one another about the axis is located on the axis of symmetry within an imaginary circle having its center located on a line formed between the axis and the joint.

The objects of the present invention are further attained by a carrier element constructed for the integrated reception of the bonding assembly, which has a stable construction and a relatively low weight, and which forms a unit with the bonding assembly. The unit for the necessary movements in the plane can be supplied in freely adjustable manner to a working station constructed for producing the wire connections to the electronic components.

The carrier element in the apparatus according to the invention may be constructed as a one-piece, rigid, casing-like cellular structure including an upper cover wall and a lower base, and walls interconnecting the cover and the lower base so as to form a parallelepiped hollow body with chambers for the reception and pivotal mounting of a bonding assembly, an electromotive drive operatively connected thereto and an encoder. On the underside of the carrier element may be provided a vacuum pre-stressable air cushion bearing substantially formed by a vacuum zone completely surrounded by a pressure zone.

The aforementioned objects, features and advantages of the invention will, in part, be pointed out with particularity, and will, in part, become obvious from the following more detailed description of the invention, taken in conjunction with the accompanying drawing, which form an integral part thereof.

BRIEF DESCRIPTION OF THE DRAWINGS

In the drawings:

FIGS. 2a shows a coordinate system for the movements of the apparatus;

DETAILED DESCRIPTION OF THE PREFERRED EMBODIMENTS

Figure 1:
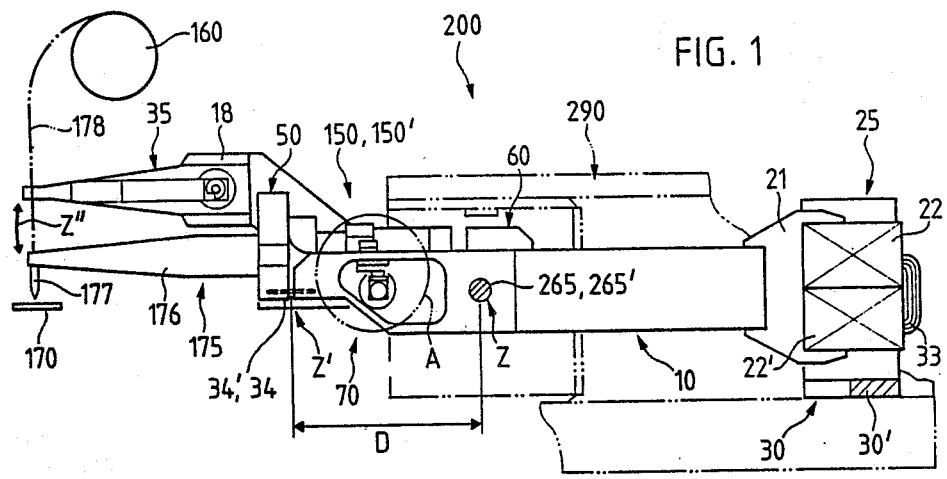
FIG. 1 is a schematic side view of the apparatus for ultrasonic contact wire connection according to the invention.

Referring now in greater detail to FIG. 1 for providing a general system survey and FIG. 2, an apparatus 200 for use in semi-conductor connecting technology is shown, which will be described in greater detail hereinafter.

Figure 2:
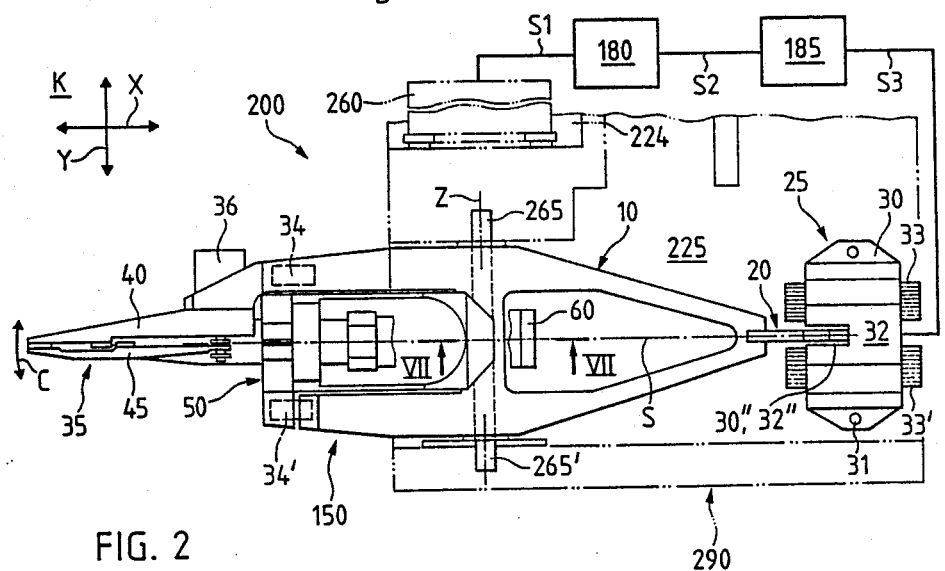
FIG. 2 is a plan view of the apparatus of FIG. 1.

Apparatus 200 essentially comprises a carrier member 290 shown in outline by dot-dash lines in FIGS. 1 and 2, which is constructed as a rigid, casing-like cellular structure with at least two usable, inner chambers 224, 225 (FIG. 2). Carrier element 290 is used for receiving a bonding or contacting assembly or arrangement 150 or 150', an incremental encoder 260 or a similar suitable device mounted in chamber 224 of carrier member 290 and operatively connected with the bonding assembly or arrangement 150 or 150', as well as an electromotive drive 25 operatively connected to bonding assembly 150 or 150'.

Bonding assembly 150 or 150' operatively connected at one end to the electromotive drive 25 essentially comprises a first support frame 10, a second support frame 50, 50' constructed for receiving an energy transducer 175, 175', known per se and a correspondingly constructed clamping device 35. Bonding assembly 150, 150' operatively connected to drive 25 is mounted with the individual parts thereof about a common, substantially horizontally positioned axis Z on two journals or pins 265, 265' by a few radians in arrow direction Z" (FIG. 1) and in a substantially oscillating or vibrating manner in carrier assembly 290.

As a function of the pivoting movement in arrow direction Z", as diagrammatically shown in FIG. 2, movement-dependent or-indicative signals S1 are supplied from encoder 260 to a first evaluation unit 180, and the signals S1 evaluated and processed in the latter are supplied as signals S2 to a first regulating or adjusting unit 185 and then as control or regulating signals S3 to the electromotive drive 25.

Apparatus 200 comprising the essential parts 290 and 260 and the bonding assembly 150 or 150' forms a closed functional unit which is constructed for the highly dynamic, exact delivery of the transducer 175, 175' arranged on bonding or contacting assembly 150, 150' (FIGS. 1 and 13) and provided with a horn 176 and a capillary element 177, to a working station, i.e. to a diagrammatically represented chip or electronic component 170.

FIG. 1 also shows a diagrammatically represented wire spool 160 of a non-shown conventional bonding wire unwinding mechanism, from which a bonding wire 178 is supplied to the clamping device 35 on bonding assembly 150 or 150' and from there the wire is centrally passed into capillary element 177. The necessary pressure or compressive force of capillary element 177 is substantially achieved by the action or oscillations of the electromotive drive 25.

In a first phase of operation, corresponding contacts 71, 72 of a contacting device 70 (FIG. 12) are operatively connected to the first support frame 10 and to the second support frame 50 constructed for receiving transducer 175. When a corresponding force acts on chip 170, the contacts 71, 72 are opened in a second phase, and corresponding signals are supplied to the transducer 175 by means of which a not shown wire ball partly melted in the known per se manner at the wire end is pressed by capillary element 177 onto chip 170.

By means of non-shown but any conventional suitable drives operatively connected to carrier member 290, apparatus 200 is moved on a correspondingly constructed, non-shown sliding plate in accordance with the coordinate system K shown in FIG. 2a along two coordinates oriented at right angles to one another in the plane substantially in arrow direction X and Y so as to be adjustable in freely suspended manner. In order to obtain a suspended movement of the complete apparatus 200 on the correspondingly constructed, non-shown base plate, the bottom of the carrier member 290 is provided with a respective air cushion bearing.

Figure 3:
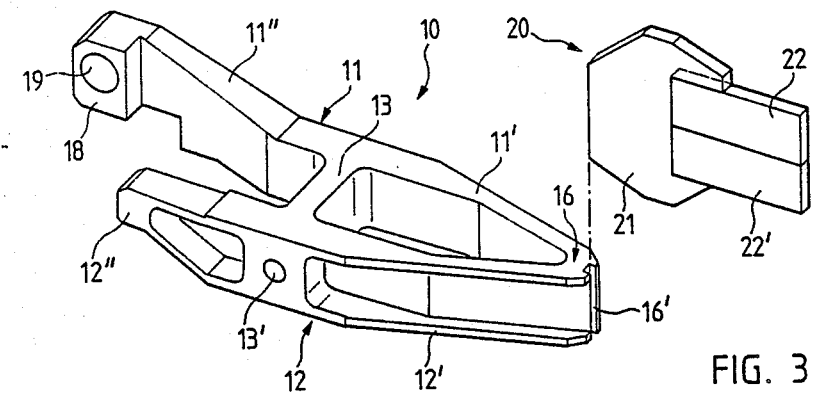
FIG. 3 is an exploded perspective view of a support frame for the bonding assembly of the apparatus according to FIG. 1.
Figure 4:
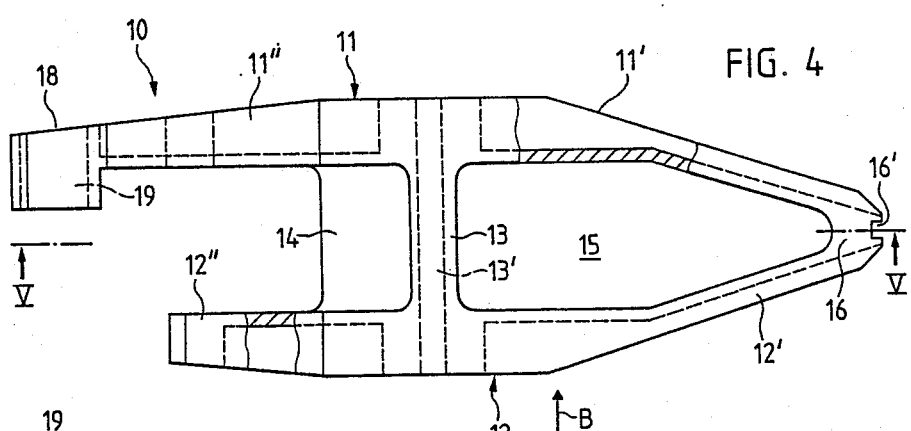
FIG. 4 is a plan view, partially in section, of the support frame according to FIG. 3.

FIG. 3 shows an embodiment of the first support frame 10 in perspective view, which is also shown, on a larger scale, in a plan view in FIG. 4. Two support arms 11, 12 are provided, which have two substantially parallel, spaced, front, first portions 11", 12" interconnected in the central region by a web 13, as well as two second portions 11', 12' interconnected in a rear region 16. Between the two rear, sloping portions 11', 12' are provided a base 15 extending from rear region 16 to web 13 and a base portion 14 extended between the two front portions 11", 12". In the vertical wall of the rear region 16, is provided a vertical, groove-like recess 16' for receiving a magnet member 20 in spaced manner therefrom. The substantially sword-shaped magnet member 20 is in operative connection with the electromotive drive 25 (FIG. 1) and comprises a fastening plate 21 and two magnet plates 22, 22' arranged thereon and is connected by non-shown conventional means, e.g. by bonding or the like, to the first support frame 10.

Figure 5:
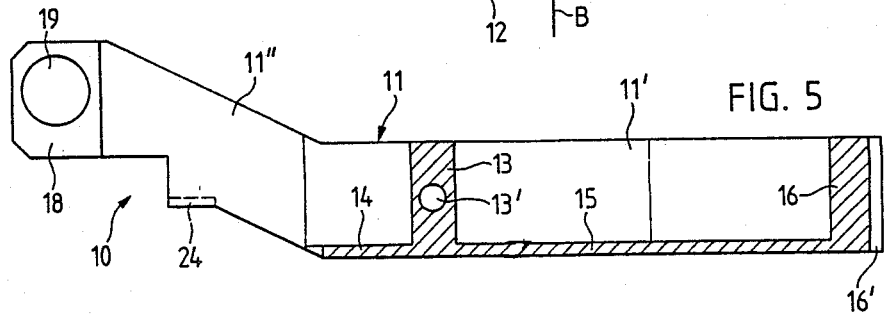
FIG. 5 is a sectional view taken along line V-V in FIG. 4.
Figure 6:
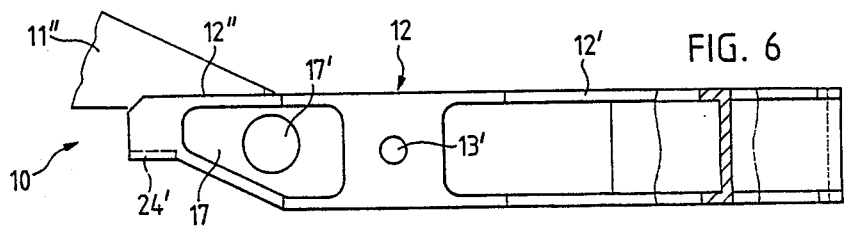
FIG. 6 is a view of the portion of the support frame in arrow direction B in FIG. 4.

Support arms 11, 12 with their portions 11', 11" and 12', 12", as shown in a partial section view in FIG. 6, have a substantially [-shaped profile cross-section. Web 13 interconnecting the two support arms 11 and 12 is penetrated with a bore 13' oriented substantially at right angles to support arms 11, 12. As shown in FIG. 5, the front portion 11" of support arm 11 is bent upwards with respect to portion 11' and is provided at its front end with a bearing part 18, which is penetrated with a bore 19 and, as shown in FIGS. 1 and 2, is provided for receiving and fastening the clamping device 35.

FIG. 5 shows the first support frame 10 in section along line V—V in FIG. 4 and it is possible to see support arm 11 with the substantially horizontal portion 11', the portion 11" bent upwards with respect to portion 11' with the bearing part 18 traversed by bore 19, web 13 with bore 13', base 15 with the central region 16 shaped in web-like manner and the base portion 14. On the front portion 11" is provided a recess 24 for receiving and fastening a first spring element 34 (FIGS. 1 and 2).

FIG. 6 shows the first support frame 10 in a view seen in the direction of arrow B in FIG. 4 and it is possible to see the horizontal support arm 12 formed of portions 12', 12" and a part of the bent portion 11" of support arm 11. Front portion 12" is provided with a recess 24' for receiving and fastening a second spring element 34' (FIGS. 1 and 2). On the front portion 12" of support arm 12 is provided a pocket 17 with openings 17' and in this pocket is located the contacting device 70 operatively connected to the first and second support frames 10, 50 as described in conjunction with FIG. 12.

Figure 8:
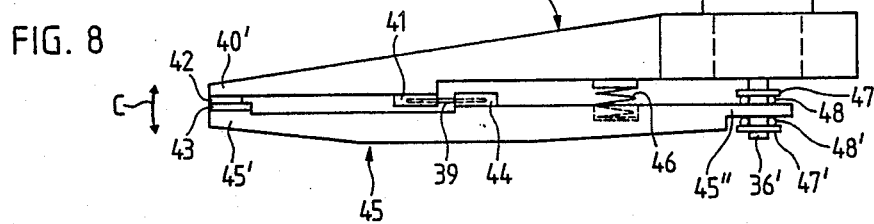
FIG. 8 is a side view of a clamping device for the bonding assembly of the apparatus according to FIGS. 1 and 2.

FIG. 8 shows a plan view of the clamping device 35. The clamping device comprises a first clamping part or shim 40 and a second clamping part or shim 45, the clamping parts 40, 45 being operatively interconnected at one end by means of a journal or pin 36' of an electromagnet 36 and substantially in the central region by a connecting element in the form of a leaf spring 39. The rear end 45" of clamping part 45 is positioned between two elastic elements 48, 48' (O-rings), which are held by disks 47, 47' on pin 36' of electromagnet 36. The leaf spring 39 is detachably-fixed by a correspondingly constructed retaining part 41 on the first clamping part 40 and by a second retaining part 44 to the second clamping part 45, using a non-shown conventional fastening means (screw connection). Leaf spring 39 essentially forms a joint for the two clamping parts 40, 45 movable relative to one another in the arrow direction C by electromagnet 36 counter to the direction of the restoring force of a compression spring 46 located between two clamping parts 40, 45. At the front end 40' of clamping part 40 and at the front end 45' of clamping part 45 is in each case provided a clamping plate 42, 43 each having an absolutely planar bearing face. The relatively thin, lying in the $\mu$ range, bonding wire 178 (FIG. 1) may be fixed and then released again between the two bearing faces.

Figure 9:
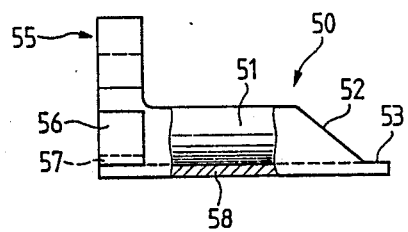
FIG. 9 is a side view of a second support frame of the apparatus of FIG. 1.
Figure 10:
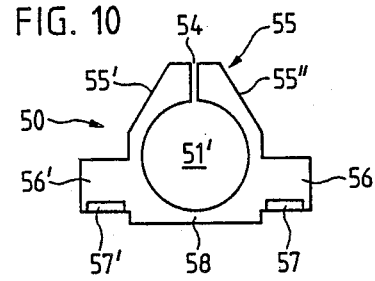
FIG. 10 is a front view of the second support frame of FIG. 9.

FIGS. 9 and 10 show the second support frame 50 for receiving transducer 175, in a partly broken away view and also in a side view. Support frame 50 having a base 58 has a substantially half-shell-like body 51, which in the front region has a web-like clamping part 55 formed with a bore 51' and having two portions 55', 55" separated by a slit 54 (FIG. 10) and provided in the rear region with a bevel or slope 52 and a projection 53.

Figure 13:
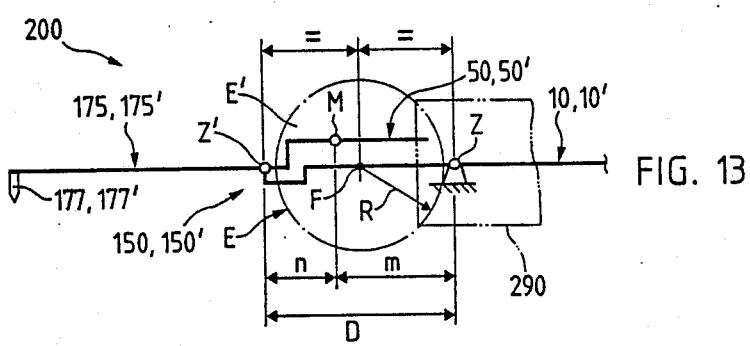
FIG. 13 is a diagrammatic representation of the bonding assembly of the apparatus shown in FIG. 1.

In the front region, each of the two clamping portions 55', 55" which are compressible for securing the transducer 175 using non-shown screws or the like, is provided with a lateral bearing part 56, 56', in which is formed, in each case, a pocket-like recess 57, 57' for receiving and fixing the spring elements 34, 34'. The individual spring element 34, 34', as diagrammatically shown in FIGS. 1 and 2 and 13, is, on the one hand, operatively connected to the first support frame 10 and, on the other hand, to the second support frame 50 and essentially forms an articulation or joint Z' spaced at a distance D from axis Z and by means of which the second support frame 50, together with the transducer 175, which is, for example, an ultrasonic transducer, is movable relative to the first support frame 10 in the arrow direction Z" for releasing contacts 71, 72 (contacts no longer in operative connection). Axis Z and articulation Z' in each case form an operative connection point of the two support frames 10 and 15, constituting a so-called pivot axis.

Figure 11:
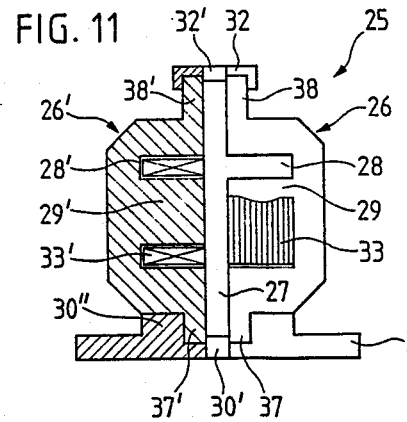
FIG. 11 is a schematic illustration, partially in section, of an electromotive drive for the bonding assembly of the apparatus according to FIGS. 1 and 2.

FIG. 11 shows in detail the electromotive drive 25, half in elevation and the other half in a sectional view. Drive 25 essentially comprises a base plate 30 constructed as a carrier member, two stator members 26, 26' spaced from one another by a gap 27, two coil members 33, 33' and a retaining part 32. The two substantially E-shaped stator members 26, 26' have recesses 28, 28' separated from one another by a central web 29, 29' and in which are arranged the coil members 33, 33'. The stator members 26, 26' have lower webs 37, 37' and upper webs 38, 38'. In the base plate 30 provided with corresponding recesses, the lower webs 37, 37' are spaced by a web 30'. The upper webs 38, 38' are also maintained in a spaced relationship from one another by a web 32' in retaining part 32 having non-shown recesses. Base plate 30 and the upper retaining part 32 are, as diagrammatically shown in FIG. 2, in each case provided with a slit 32' extending up to web 30' or a slit 32" extending up to web 32' for the movement of the sword-shaped magnet member 20 with magnet plates 22, 22'. Drive 25 is detachably fixed by means of screws 31 (FIG. 2) to the bottom of chamber 225 of carrier member 290.

By corresponding excitation, preferably by a controlled or regulated direct current excitation of the coil members 33, 33', a vertical relative movement of the magnet member 20 on the first support frame 10 with respect to the stator members 26, 26' or the drive 25 fixed to carrier member 290 is obtained.

Figure 7:
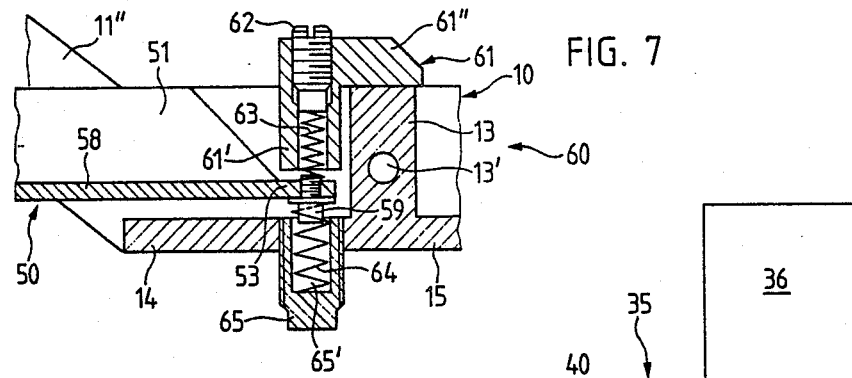
FIG. 7 is a sectional view through an adjusting device for a second support frame of the bonding assembly arranged in the first support frame of the apparatus of FIGS. 1 and 2.

FIG. 7 shows a device 60 for setting and adjusting the relative movement of the second support frame 50 with respect to the first support frame 10 pivotable by a few radians about the two journals or pins 23, 23'. Device 60 comprises an angle piece 61, which is fixed with a leg part 61" to web 1 of support frame 10 using non-shown known fastening means and in a vertical web part 61' has a non-specified bore, which serves to receive a compression spring 63 which can be pressed by a set-screw 62 from one side against projection 53 of the support frame base 58. A setscrew 65 located in the base 14 of the first support frame 10 and adjustable with a thread has a blind bore 65' for receiving a compression spring 64 acting against the other side of the projection 53. The second compression spring 64 is preferably maintained in the operative position by a pin 59 arranged on projection 53. First setscrew 62 and second setscrew 65 can be fixed by non-shown known fastening means for securing their position after the actual adjustment has taken place. By means of the aforementioned device 60 constructed as a spring tensioning system it is possible to adjust the necessary impact or contact pressure of the capillary element 176 on chip 170 in an exact manner in accordance with requirements.

Figure 12:
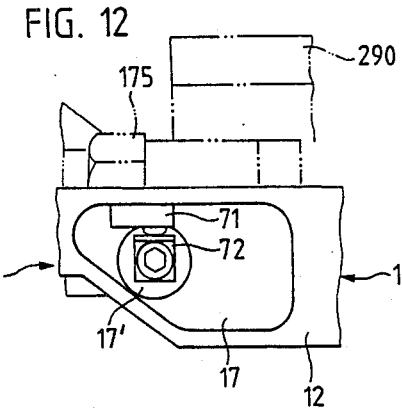
FIG. 12 shows a detail, indicated by circle A in FIG. 1, of a contacting mechanism in operative contact with the two support frames.

FIG. 12 shows the contacting device 70 and a portion of the carrier member 290, a portion of the ultrasonic transducer 175 and the support arm 12 of the first support frame 10 having recess 17 and opening 17'. Using suitable means, in recess 17 is arranged a first, diagrammatically represented contacting member 71 and on the second support frame 50 the second contacting member 72 penetrated by opening 17'.

The second support frame 50 forming a unit with the transducer 175 is, as is diagrammatically shown in FIG. 13, arranged with the articulation Z' at a distance D from axis Z. Axis Z of support frame 10 is essentially formed by the pins or journals 265, 265' arranged in the first support frame 10 and mounted in carrier member 290, and articulation Z' is formed by spring elements 34, 34' arranged on the first and second support frames 10, 50, respectively. The two support frames 10, 50 are so operatively interconnected by spring elements 34, 34' that the second support frame 50 is movable exclusively in a specific working phase (pressing or capillary element 176 onto chip 170) of bonding assembly 150 relative to the first support frame 10 in the direction of arrow Z".

The construction of the second support frame 50 and the arrangement of transducer 175 in support frame 5 is selected in such a way that an assumed and represented mass center M of parts 175 and 50 located on the symmetry axis S (FIG. 2) and which can be mathematically determined, is located within an imaginary circle E defining the movement plane, but preferably in the upper semicircle E' of E (FIG. 13). Circle E is arranged with its center F in the middle of a line formed between axis Z and articulation Z', the radius R of circle E being < half the distance D.

In the above-described, preferred arrangement the location of the mass center M in the vicinity of the upper semicircular plane E' ensures an optimal balancing and mass distribution of the individual elements, so that during the common pivoting movement (first movement phase) of the corresponding parts 10, 50, 175 in the arrow direction Z" (FIGS. 1), an adequate positional stability is ensured, i.e. a relative movement of transducer 175 with support frame 50 with respect to the first support frame 10 is largely excluded during the first pivoting movement.

Figure 14:
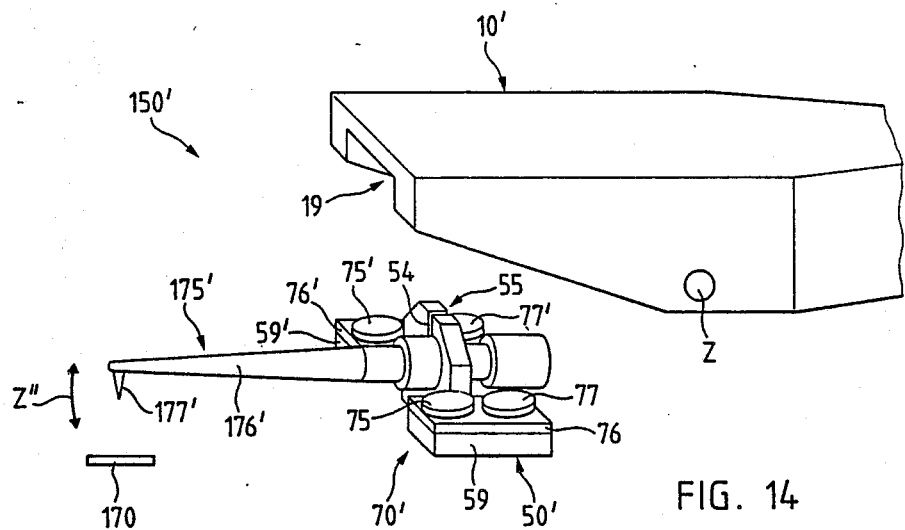
FIG. 14 is an exploded perspective view of a second embodiment of the bonding assembly.

FIG. 14 shows, in an exploded perspective view, an embodiment of the contacting or bonding assembly 150', and it is possible to see a portion of support frame 10' and the contacting device 70'. Support frame 10' provided with corresponding bores for axis Z has a substantially inverted U-shaped profile cross-section and, at one rear end, is constructed identically to the support frame 10 (FIGS. 1 and 2) and is provided with the magnet member 20, which is operatively connected with the electromotive drive 25 not shown in FIG. 14. At the other, front end, support frame 10' is constructed with a correspondingly constructed recess 19 for contacting device 70' and not designated assembly surfaces for fixing the contacting device 70'. Contacting device 70' has a support frame 50' for mounting transducer 175', which may be ultrasonic, and has two spaced-apart bearing parts 59, 59' interconnected by a clamping part 55. Support frame 50' is largely constructed like support frame 50 in FIGS. 9 and 10 and comprises the clamping part 55 framed by portions 55', 55" and gap 54 and which serves to receive and secure transducer 175'. Diverting from the support frame 50 according to FIGS. 9 and 10, on the two bearing parts 59, 59' of support frame 50' is in each case provided a conductor plate 76, 76' or the like and the same is fixed by non-shown means.

In the embodiment shown in FIG. 14, on each printed circuit board 76, 76' are provided two spaced piezoelectric elements 75, 77 or 75', 77', which are electrically connected by non-shown known connection means to the corresponding plate 76 or 76'. In the fitted, not shown state, in which the second support frame 50' is fixed by a not shown screw connection to the first support frame 10', the four piezoelectric elements 75, 75' and 77, 77' are operatively connected with the first support frame 10' under corresponding pre-tension.

The specific arrangement of the mass center M within circle E described hereinbefore in connection with FIG. 13 is substantially identically constructed in this embodiment. Clamping part 55 of support frame 50' equidistantly arranged between the corresponding piezoelectric elements 75, 77 or 75', 77' here forms the imaginary articulation Z' (FIG. 13) for the relative movement of the second support frame 50' with respect to the first support frame 10'.

In this preferred embodiment, during the pivoting movement Z" of bonding assembly 150', when the capillary element 177' strikes against chip 170, a corresponding force is produced which, as a result of the described geometrical arrangement, ensures that the two front piezoelectric elements 75, 75' are correspondingly loaded in addition to the pre-tension and the two rear piezoelectric elements 77, 77' are relieved, due to the $\mu$-range mobility or parts 175', 50' about the imaginary articulation Z".

Figure 14A:
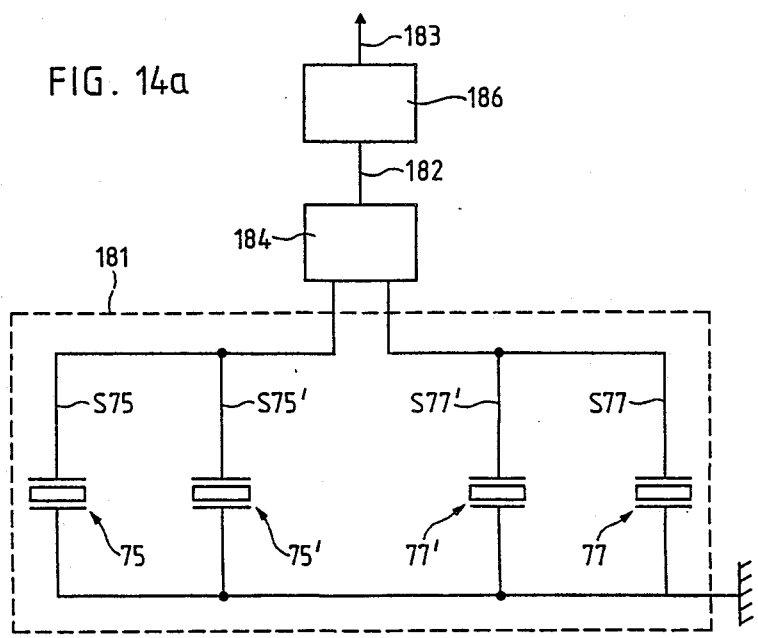
FIG. 14a is an electric circuit block diagram for the bonding assembly of FIG. 14.

Also in the case of the embodiment according to FIG. 14, as for the embodiment of FIG. 2, corresponding signals S1 are processed in the first evaluation unit 180 and supplied as signals S2 to the first regulating unit 185, whilst also being supplied as control or regulating signals S3 to electromotive drive 25. As a function of the loading and unloading of piezoelectric elements 75, 75' and 77, 77' occurring in the case of capillary contact (touch down) and as shown in the block diagram of FIG. 14a, corresponding force-dependent signals S75, S75' and S77, S77' are supplied across a circuit 181 to a second evaluation unit 184, where e.g. impedance conversion, amplification and/or differentiation of signals S75, S75' and S77, S77' takes place. The thus obtained values are preferably supplied in the form of a voltage via an output 182 to a second regulating unit 186 for forming corresponding control or regulating signals, which are supplied via an output 183 to electromotive drive 25.

The signals S75, 75' and S77, 77' preferably continuously determined in this way during the bonding process can be processed for the detection of the capillary contact and for evaluating the force pattern, as well as for controlling or regulating the electromotive drive 25 and therefore for regulating the bonding force.

Figure 15:
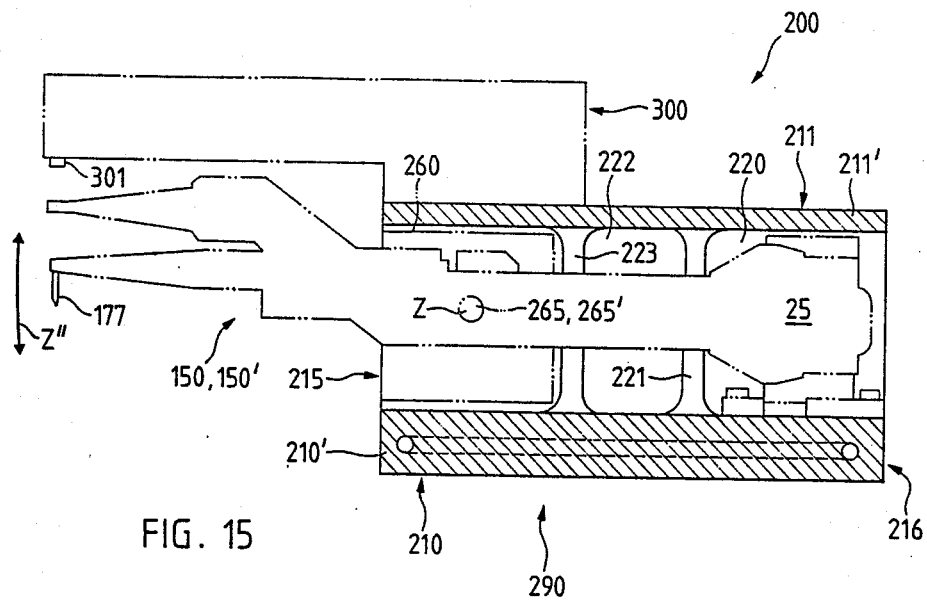
FIG. 15 is a sectional side view of a carrier element for the bonding device of the apparatus of FIG. 1.
Figure 16:
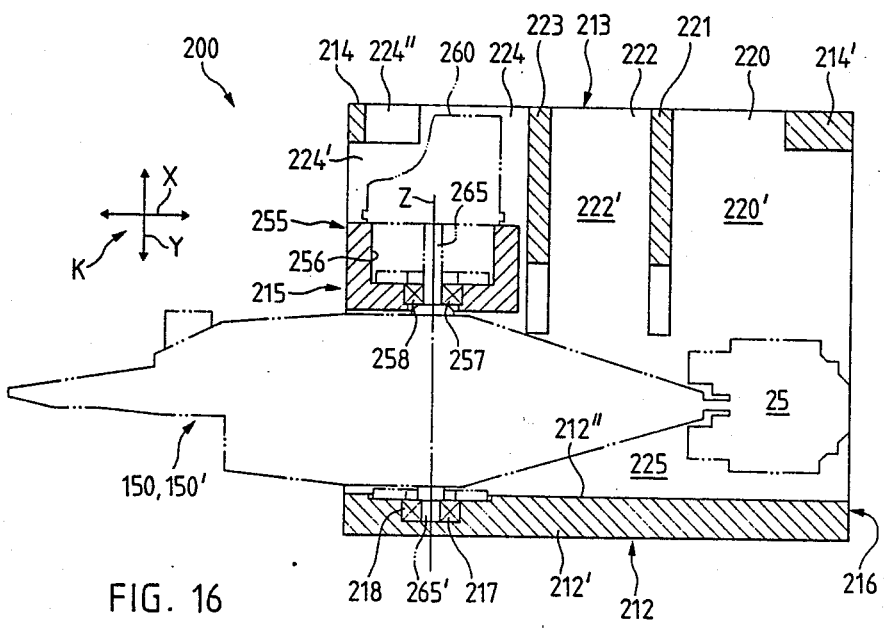
FIG. 16 is a sectional plan view of the carrier element according to FIG. 15.

FIG. 15 shows in a sectional side view and FIG. 16, in a sectional plan view, the apparatus 200, which essentially comprises bonding assembly 150 or 150' (bonder) shown in outline form by dot-dash lines, a carrier-like extension arm 300 (only shown in FIG. 15) with an optical scanning element 301 (sensor) arranged thereon and the corresponding carrier member 290 for parts 150 or 150' and 300. The rocker-like bonding assembly 150 or 150', as shown in FIG. 16, provided with the diagrammatically represented capillary element at the front end is insertable in the substantially casing-like carrier element 290 and is operatively connected at one end to electromotive drive 25. Approximately in the central region, bonding assembly 150 or 150' is mounted by means of a pin or journal 265 spaced from drive 25 in a correspondingly constructed bearing piece 255 and by means of a second corresponding pin or journal 265' in wall 212' of carrier member 290 (FIG. 2). The bearing piece 255 provided with offset recesses 256, 257 is penetrated by journal 165, which is operatively connected to the incremental encoder 260 shown diagrammatically by means of dot-dash lines. Bonding assembly 150 or 150' is mounted in a bearing part 258 (ball bearing) arranged in recess 257 and with the other journal 265' in a bearing part 218 so as to pivot by a few radians about the common axis Z in the arrow direction Z" (FIG. 1).

FIG. 16 shows, in section and in a plan view, carrier member 290 for apparatus 200 and it is possible to see the bearing piece 255 constructed for receiving and mounting measuring element or incremental encoder 260 and for mounting the bonding assembly 150 or 150' and which is fitted into the carrier member 290, whilst being interchangeably fixed by non-shown means e.g. a screw connection. It is pointed out at this point that the casing-like carrier member 290 can be provided in this area with the bearing piece 255 forming a unit with member 290 and serving to receive and mount parts 260, 265 and 150 or 150'.

Figure 17:
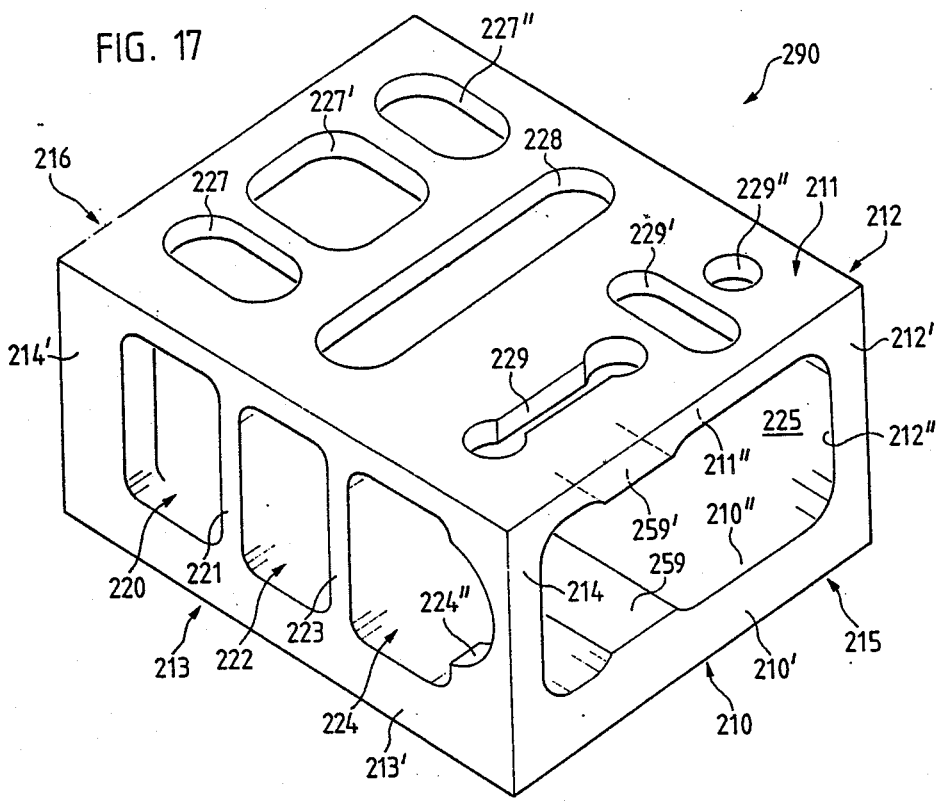
FIG. 17 is a perspective view of the carrier element, on enlarged scale.

The carrier member 290 shown in FIG. 17 is constructed substantially as a parallelepipedic, one-piece hollow body with usable cavities for receiving the essential parts 150 or 150', 25 and 260 and has an underside 210, a top side 211 for receiving arm 300, sides 212, 213, an end 215 and a back 216 and will be described in greater detail hereinafter.

The casing-like carrier member 290 is constructed as a rigid cellular structure and has on its underside 210 a base 210' constructed as a horizontal plate and in parallel spacing therefrom on its top side 211 a cover wall 211'. On side 212 is provided a first, vertical wall 212' and on the other, facing side 213, a second, vertical wall 213'. The two walls 212', 213' connecting base 210' with cover wall 211' are parallel and spaced from one another.

For the centering, mounting and fixing of the insertable piece 255, in the front area of carrier member 290 on the inside 210" of base 210' and on the inside 211" of cover wall 211' are, in each case, provided a corresponding bearing or centering surface 259, 259' partly shown in FIG. 17.

The second, vertical wall 213' has spaced recesses 220, 222, 224 and between recesses 220, 222 and 222, 224 is, in each case, provided a rib 221, 223. Corresponding cavities or chambers 220', 222' and 224' are formed in the interior of carrier member 290, cf. FIG. 16 by the ribs 221, 223 extending from base 210' to cover wall 211' and somewhat inwards towards the first wall 212' and by the two corner pieces 214, 214' of wall 213'. The front corner piece 214 is provided with a corresponding recess 224' for engaging measuring element 260. The main chamber 225 is provided in addition to chambers 220', 222' and 2224'. Chamber 224' is used for receiving the measuring element 260 and the main chamber 225 for receiving the bonding assembly 150 or 150' (not shown in FIG. 17) and drive 25.

Wall 213' and the non-indicated wall of back 216 are provided with non-shown, spaced tapholes for fixing the carrier member 290 to a not shown electromotive drive for the adjusting movement oriented in the coordinate system K of FIG. 2a in arrow directions X and Y.

As shown in FIG. 17, cover wall 211' is also formed with spaced recesses 227, 227', 227", 228, 229, 229', 229". The outer face of cover wall 211' is constructed for receiving the extending arm 300 (FIG. 15), which is detachably fixed to carrier member 290 by non-shown known fixing means.

Recesses 220, 222, 224 and 227, 227', 227", 228, 229, 229',229" provided in vertical wall 213 and cover wall 211' are used for the mounting and servicing of the individual essential parts 150 or 150', 25 and 260 and ensure, whilst retaining the stability, a weight reduction of carrier member 290, which is advantageous for the freely suspended adjustability.

The first wall 212' facing the second wall 213' is provided on the inside 212' with an offset recess 217 (FIG. 16), in which is arranged the bearing 218 for journal 265' of bonding assembly 150 or 150'. The outer face of the first wall 212' is constructed as a planar, preferably ground surface and serves as a so-called air bearing contact surface for a non-shown sliding part inoperative connection carrier member 290 and operable by not shown means.

Figure 18:
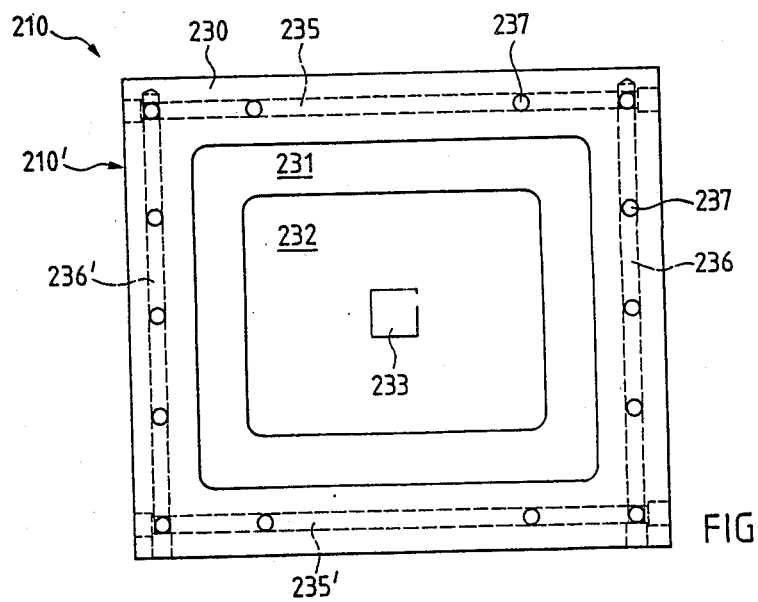
FIG. 18 shows a bottom of the carrier element of FIG. 15.

FIG. 18 shows the base 210' or carrier member 290 associated with the not shown sliding plate. Base 210' is preferably vacuum-pre-stressed with an air cushion bearing and is operatively connected to the sliding plate, being movable in freely suspended manner substantially in the horizontal plane. Base 210' has a fully surrounding pressure zone 230 and is provided with a first recess 231 directed inwards into the base wall with respect to pressure zone 230 and a second recess 232 inwardly directed with respect to the first recess 231. Substantially in the central area of the second recess 232 is provided a mounting part 233. Recess 231 serves to receive a plate-like measuring element, e.g. a per se known glass scale with correspondingly arranged and oriented line or graduation units.

In the vicinity of pressure zone 330 is provided in base wall 210', as shown in a plan view in FIG. 18, a channel system formed of channels 235, 235' and 236, 236', as well as several spaced bores 237. The bores emanating from the outer face of pressure zone 230 merge into channels 235, 235' or 236, 236' externally provided with suitable connections.

It is pointed out here that the sliding movement of the carrier member 290 forming a unit with parts 260, 25, 150 or 150' and 300 by means of the suitable known drives acting on sides 212, 213, 216 takes place in the arrow directions X and Y according to the Coordinate system K shown in FIGS. 2a and 16. The special construction of the carrier member 290 in conjunction wit the arrangement and mounting of the bonding assembly 150 or 150', constructed as a so-called rocker in the interior of carrier member 290, the correspondingly constructed side walls 212, 213 and back 216 operatively connected with the electromotive drives or with a corresponding part operable by corresponding means and in conjunction with the vacuum pre-stressed base 210 operatively connected to a sliding plate ensuring that the drive of the complete apparatus be moved in respect to the center of gravity of the mass thereof, so that no pitching movements occur on carrier element 290 and a highly dynamic delivery movement of apparatus 200 to a working station.

There has been disclosed heretofore the best embodiment of the invention presently contemplated. However, it is to be understood that various changes and modifications may be made thereto without departing from the spirit of the invention.

What is claimed is:

1. In an apparatus for bonding wire connection to electronic components for use in semiconductor connecting technology, particularly for an ultrasonic bonding wire connection of circuits to electronic components, comprising bonding means mounted so as to pivot about an axis and including a first support frame operatively connected to and movable by an electromotive drive, a second support frame, and an energy transducer including a capillary element and received in said second support frame, said capillary element being engageable with individual electronic components to apply wire connection thereto, the improvement comprising a carrier member, said first and second support frames together with said transducer being mounted so as to pivot about an axis Z in said carrier member, and the second support frame with said transducer being additionally movable about an articulation (Z') spaced at a distance (D) from the axis (Z) relative to the first support frame, and wherein for obtaining a necessary positional stability, said first and second frames and said transducer have a common mass center (M) and are pivotable together about the axis (Z) on a symmetry axis (S) within an imaginary circle (E), a center of which is located on an imaginary line formed between the axis (Z) and the articulation (Z').

2. Apparatus according to claim 1, wherein for the formation of movement-dependent and force-dependent signals a contacting device is provided in said bonding means, which is associated with the said first and second support frames and operatively connected to said transducer.

3. Apparatus according to claim 2, and further comprising a first evaluation unit connected to said bonding means for determining and processing movement-dependent signals (S1) of said transducer, and a first regulating unit for forming control electric signals (S3) and being interconnected between said first evaluation circuit and said electromotive drive for operating the electromotive drive.

4. Apparatus according to claim 3, and further comprising a second evaluating unit connected to said transducer for determining and processing force-dependent signals (S75, S75') and (S77, S77') of said transducer, and a second regulating unit connected to said second evaluation unit and said electromotive drive for forming further electrical signals for operating said electromotive drive.

5. Apparatus according to claim 4, wherein said contacting device of said bonding means comprises at least one piezoelectric element arranged on said second support frame and electrically connected to a printed circuit board positioned on said second frame, said piezoelectric element forming corresponding signals indicative of and produced during the pivotal movement of said transducer.

6. Apparatus according to claim 5, wherein on either side of said transducer relative to said symmetry axis (S), said contacting device has a printed circuit board and each individual printed circuit board being fixed via a corresponding bearing to said second support frame and being constructed for receiving and electrically connecting two piezoelectric elements, said piezoelectric elements being spaced from one another relative to said articulation (Z') which is substantially formed by a clamping part of said second support frame.

7. Apparatus according to claim 6, wherein said piezoelectric elements are arranged and fixed symmetrically to one another on printed circuit boards with respect to a longitudinal axis of said transducer and with respect to said articulation (Z').

8. Apparatus according to claim 1, wherein the mass center (M) located on said symmetry axis (S) and mathematically determinable is arranged in an upper semicircle (E') of said imaginary circle (E) and a radius (R) of the imaginary circle being smaller than half (R<D/2) the spacing (D) between said axis (Z) and said articulation (Z').

9. Apparatus according to claim 1, wherein a front region of said first support frame is constructed for securely receiving a wire clamping device, which has two clamping portions operatively interconnected with one another at an articulation formed by a leaf spring and provided in a front region thereof with clamping plates, operable by an electromagnet acting on said clamping portions against a restoring force of a restoring spring between said clamping portions.

10. Apparatus according to claim 1, wherein a relative movement of said second support frame with respect to said first support frame is adjustable by an adjusting device acting on said second support frame and provided with compression springs each having an adjustable spring tension.

11. Apparatus according to claim 1, wherein said first support frame has one end constructed for a pivotal bearing of said second support frame and carries on another end thereof a magnet member which extends into a gap of the electromotive drive, said electromotive drive including two spaced stator members and coil members, which upon excitation thereof by an external source can be pivoted up and down by a few radians together with said first support frame about said axis (Z) oriented at right angles to a pivot movement direction (Z'').

12. Apparatus according to claim 1, wherein said bonding means with said first support frame provided with a magnet member, said electromotive drive, a clamping device provided in the bonding means, and said second support frame with said transducer are constructed as a single functional unit which forms a bonding head which can be fitted into said carrier member and is freely adjustable in a plane.

13. Apparatus according to claim 1, wherein said carrier member is constructed as a one-piece casing having a rigid cellular structure and including an upper cover wall and a lower base, side walls interconnecting the upper cover wall and the base for receiving and pivotably mounting said bonding means with the electromotive drive operatively connected therewith, and further comprising an encoder received in said carrier member, said carrier member having an underside which is provided with a vacuum zone completely surrounded by a pressure zone formed in said lower base.

* * * * *